(12) United States Patent
Lee et al.

(10) Patent No.: US 9,337,295 B2
(45) Date of Patent: May 10, 2016

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Junehee Lee, Hwaseong-si (KR); Sangjin Hyun, Suwon-si (KR); Jaeyeol Song, Seoul (KR); Hye-Lan Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/317,289

(22) Filed: Jun. 27, 2014

(65) Prior Publication Data

US 2015/0028430 A1 Jan. 29, 2015

(30) Foreign Application Priority Data

Jul. 23, 2013 (KR) ........................ 10-2013-0086892

(51) Int. Cl.
*H01L 29/78* (2006.01)
*H01L 29/49* (2006.01)
*H01L 29/66* (2006.01)
*H01L 29/51* (2006.01)

(52) U.S. Cl.
CPC ...... *H01L 29/4966* (2013.01); *H01L 29/66545* (2013.01); *H01L 29/66795* (2013.01); *H01L 29/785* (2013.01); *H01L 29/517* (2013.01)

(58) Field of Classification Search
USPC .................................................. 257/E21.209
See application file for complete search history.

(56) References Cited

U.S. PATENT DOCUMENTS

| 6,444,513 | B1 | 9/2002 | Besser et al. |
| 7,501,333 | B2 | 3/2009 | Lin et al. |
| 8,115,264 | B2 | 2/2012 | Park et al. |
| 2007/0111441 | A1* | 5/2007 | Koh et al. ..................... 438/257 |

(Continued)

FOREIGN PATENT DOCUMENTS

| JP | 09-246525 | * | 9/1997 | ............ H01L 29/778 |
| JP | 2011-054843 | | 3/2011 | |
| JP | 2012-124215 | | 6/2012 | |
| KR | 1020120070801 A | | 7/2012 | |

OTHER PUBLICATIONS

Jeon et al., "A Novel Methodology on Tuning Work Function of Metal Gate Using Stacking Bi-Metal Layers", Published in: Electron Devices Meeting, 2004, IEDM Technical Digest, IEEE International, pp. 303-306, INSPEC Accession No. 8394416 (Abstract: 2 pages).

(Continued)

*Primary Examiner* — Telly Green
(74) *Attorney, Agent, or Firm* — Myers Bigel & Sibley, P.A.

(57) ABSTRACT

Semiconductor devices and methods of manufacturing the same are disclosed. The semiconductor device a gate dielectric pattern on a substrate and a gate electrode on the gate dielectric pattern opposite the substrate. The gate electrode includes a first conductive pattern disposed on the gate dielectric pattern and including aluminum, and a second conductive pattern disposed between the first conductive pattern and the gate dielectric pattern. The second conductive pattern has an aluminum concentration that is higher than an aluminum concentration of the first conductive pattern. The second conductive pattern may be thicker than the first conductive pattern.

11 Claims, 18 Drawing Sheets

(56) References Cited

U.S. PATENT DOCUMENTS

| | | | |
|---|---|---|---|
| 2009/0065873 A1* | 3/2009 | Park et al. | 257/372 |
| 2009/0315093 A1 | 12/2009 | Li et al. | |
| 2010/0038725 A1 | 2/2010 | Chudzik et al. | |
| 2012/0238067 A1* | 9/2012 | Jeong | H01L 29/66545 438/301 |
| 2012/0319206 A1 | 12/2012 | Bidal et al. | |
| 2013/0277748 A1 | 10/2013 | Lee et al. | |

OTHER PUBLICATIONS

Jung et al., "Control of the Workfunction in Bilayer Metal Gate Stacks by Varying the First Layer Thickness", *Electrochem, Solid-State Lett*. 2011, vol. 14, Issue 4, H163-H166 (Abstract: 1 page).

* cited by examiner

SEMICONDUCTOR DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2013-0086892, filed on Jul. 23, 2013, in the Korean Intellectual Property Office, the disclosure of which is hereby incorporated by reference in its entirety.

BACKGROUND

The present disclosure relates to semiconductor devices and methods of manufacturing the same and, more particularly, to semiconductor devices including field effect transistors and methods of forming the same.

An integrated circuit may include metal-oxide-semiconductor field effect transistors (MOSFET). As sizes and design rules of semiconductor devices have been reduced, MOSFETs have been scaled down. The scale down of MOSFETs may cause a short channel effect such that operating characteristics of semiconductor devices including MOSFETs may be deteriorated. As a result, various research has been conducted to develop semiconductor devices capable of overcoming limitations caused by the increased integration of semiconductor devices, as well as improving the performance of semiconductor devices.

SUMMARY

Embodiments of the inventive concepts may provide semiconductor devices with improved driving characteristics and methods of manufacturing the same.

Embodiments of the inventive concepts may also provide semiconductor devices capable of simplifying manufacturing processes and methods of manufacturing the same.

In one aspect, a semiconductor device may include a gate dielectric pattern on a substrate and a gate electrode on the gate dielectric. The gate electrode may include a first conductive pattern on the gate dielectric pattern, the first conductive pattern including aluminum (Al), and a second conductive pattern disposed between the first conductive pattern and the gate dielectric pattern, the second conductive pattern also including aluminum and having an aluminum concentration higher than an aluminum concentration of the first conductive pattern. The second conductive pattern may be thicker than the first conductive pattern.

In some embodiments, the first conductive pattern and the second conductive pattern may further include a metal carbide.

In some embodiments, the metal carbide may include at least one of titanium (Ti), tantalum (Ta), tungsten (W), ruthenium (Ru), niobium (Nb), molybdenum (Mo), hafnium (Hf), and lanthanum (La).

In some embodiments, the gate electrode may further include a barrier pattern between the gate dielectric pattern and the second conductive pattern.

In some embodiments, the barrier pattern disposed between the gate dielectric pattern and the second conductive pattern may include titanium (Ti), tantalum (Ta), tungsten (W), ruthenium (Ru), niobium (Nb), molybdenum (Mo), hafnium (Hf), lanthanum (La), or any combination thereof.

In some embodiments, the gate electrode may further include a third conductive pattern on the first conductive pattern and a barrier pattern between the first conductive pattern and the third conductive pattern. The first conductive pattern may be disposed between the second conductive pattern and the third conductive pattern, and the barrier pattern between the first and third conductive patterns may include titanium (Ti), tantalum (Ta), tungsten (W), ruthenium (Ru), niobium (Nb), molybdenum (Mo), hafnium (Hf), lanthanum (La), or any combination thereof.

In some embodiments, the third conductive pattern may include tungsten.

In some embodiments, the semiconductor device may further include gate spacers disposed on both sidewalls of the gate electrode, respectively. The second conductive pattern may extend to be disposed between the first conductive pattern and the gate spacers, and the gate dielectric pattern may extend to be disposed between the second conductive pattern and the gate spacers.

In some embodiments, the semiconductor device may further include an active fin protruding from the substrate in a direction vertical to a top surface of the substrate. The gate electrode may cross over the active fin, and the gate dielectric pattern may extend along a bottom surface of the gate electrode to cover a top surface and sidewalls of the active fin.

In another aspect, a method of manufacturing a semiconductor device may include forming a first conductive layer on a substrate and forming a second conductive layer on the first conductive layer. The first conductive layer and the second conductive layer may be formed, for example, using an atomic layer deposition (ALD) process, and a pulsing time of an aluminum precursor may be varied during the ALD process, so that an aluminum concentration of the first conductive layer may be different from an aluminum concentration of the second conductive layer.

In some embodiments, a pulsing time of the aluminum precursor for the formation of the first conductive layer may be longer than a pulsing time of the aluminum precursor for the formation of the second conductive layer.

In some embodiments, the aluminum concentration of the first conductive layer may be greater than the aluminum concentration of the second conductive layer.

In some embodiments, the first conductive layer may be thicker than the second conductive layer.

In some embodiments, the method may further include forming a sacrificial gate pattern on the substrate before forming the first conductive layer, forming an interlayer insulating layer covering both sidewalls of the sacrificial gate pattern on the substrate, removing the sacrificial gate pattern to form a gap region exposing the substrate in the interlayer insulating layer, wherein the first conductive layer and the second conductive layer are formed to fill the gap region, and after forming the first conductive layer and the second conductive layer, planarizing the first conductive layer and the second conductive layer until the interlayer insulating layer is exposed, thereby forming a gate electrode in the gap region.

In some embodiments, the method may further include forming an active fin on the substrate before forming the first conductive layer, forming a sacrificial gate pattern crossing over the active fin on the substrate, forming an interlayer insulating layer covering both sidewalls of the sacrificial gate pattern on the substrate, removing the sacrificial gate pattern to form a gap region exposing the active fin in the interlayer insulating layer, wherein the first and second conductive layers are formed to fill the gap region, and after forming the first and second conductive layers, planarizing the first and second conductive layers until the interlayer insulating layer is exposed, thereby forming a gate electrode in the gap region.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
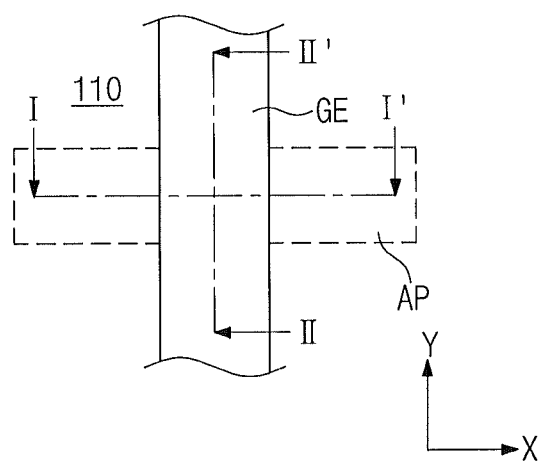
FIG. 1 is a plan view illustrating a semiconductor device according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2A:
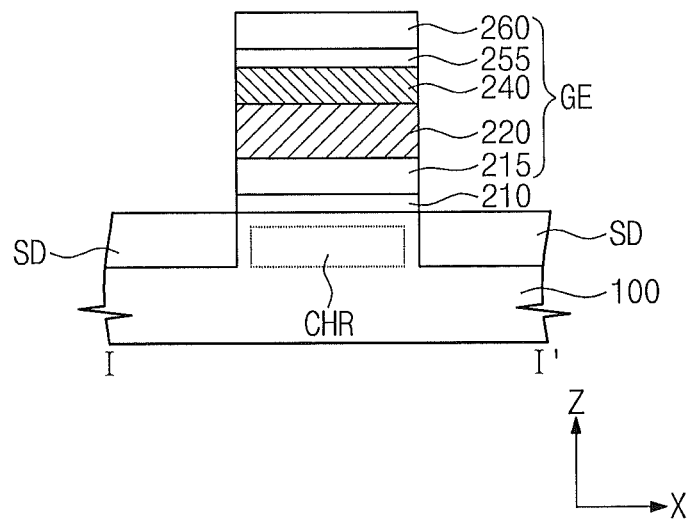
FIGS. 2A and 2B are cross-sectional views taken along lines I-I' and II-II' of FIG. 1, respectively.
Figure 2B:
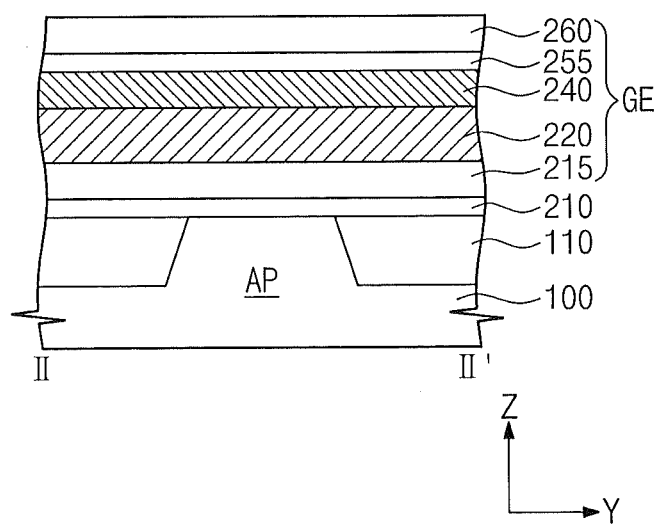

FIG. 1 is a plan view illustrating a semiconductor device according to some embodiments of the inventive concepts, and FIGS. 2A and 2B are cross-sectional views taken along lines I-I' and II-II' of FIG. 1, respectively.

Referring to FIGS. 1, 2A, and 2B, device isolation patterns 110 may be formed on or in a substrate 100 to define an active pattern AP. The substrate 110 may be a silicon substrate or a silicon-on-insulator (SOI) substrate, for example. The active pattern AP may have a line-shape extending along a first direction (e.g., an X-direction). The device isolation patterns 110 may include an oxide, a nitride, and/or an oxynitride, etc.

A gate electrode GE crossing over the active pattern AP may be disposed on the substrate 100. The gate electrode GE may have a line-shape extending along a second direction (e.g., a Y-direction) intersecting the first direction (e.g., the X-direction). Although illustrated as perpendicular in FIG. 1, the first and second directions need not be perpendicular. The active pattern AP may include a channel region CHR disposed under the gate electrode GE. Source/drain regions SD may be disposed in the active pattern AP on opposing sides of the gate electrode GE. The channel region CHR may be disposed between the source/drain regions SD. The source/drain regions SD may impart a strain, such as a tensile strain or a compressive strain, to the channel region CHR. This strain may contribute to the performance improvement (e.g., improvement of mobility) of a transistor.

A gate dielectric pattern 210 may be disposed between the gate electrode GE and the channel region CHR. The gate dielectric pattern 210 may include a high-k dielectric layer. For example, the gate dielectric pattern 210 may include at least one of a hafnium oxide layer, a hafnium silicate layer, a zirconium oxide layer, or a zirconium silicate layer, etc.

The gate electrode GE may include a first conductive pattern 240 on the gate dielectric pattern 210, and a second conductive pattern 220 between the gate dielectric pattern 210 and the first conductive pattern 240. The first conductive pattern 240 may be in contact with the second conductive pattern 220.

The first conductive pattern 240 and the second conductive pattern 220 may include both aluminum (Al) and a metal carbide. The metal carbide may be a compound of carbon (C) and at least one of titanium (Ti), tantalum (Ta), tungsten (W), ruthenium (Ru), niobium (Nb), molybdenum (Mo), hafnium (Hf), and lanthanum (La).

An aluminum concentration of the second conductive pattern 220 may be greater than an aluminum concentration of the first conductive pattern 240. In some embodiments, a difference between the aluminum concentrations of the second and first conductive patterns 220 and 240 may be equal to or greater than about 4 at %. The second conductive pattern 220 may be thicker than the first conductive pattern 240. In some embodiments, a sum of thicknesses of the first and second conductive patterns 240 and 220 may be about 60 Å or less.

If the gate electrode GE is formed of a conductive material including aluminum (Al), a work function and a resistance of the conductive material may be varied depending on an aluminum concentration in the conductive material. In other words, if the aluminum concentration is high in the conductive material, the work function of the conductive material may be lowered, but the amount of naturally oxidized aluminum may be increased, which increases the resistance of the conductive material. On the contrary, if the aluminum concentration is low in the conductive material, the work function of the conductive material may be increased, but the amount of naturally oxidized aluminum may be reduced, which reduces the resistance of the conductive material. It may be difficult to control driving characteristics of a semiconductor device including the gate electrode GE due to the trade-off relationship between the work function and the resistance of the conductive material according to the aluminum concentration in the conductive material.

According to some embodiments of the inventive concepts, the gate electrode GE may include the first conductive pattern 240 and the second conductive pattern 220 having different aluminum concentrations from each other. The second conductive pattern 220 having the relatively high aluminum concentration is disposed between the gate dielectric pattern 210 and the first conductive pattern 240 having the relatively low aluminum concentration. Thus, the presence of the first conductive pattern 240 may reduce or prevent a surface of the second conductive pattern 220 from being naturally oxidized. As a result, the work function of the gate electrode GE may be reduced by the second conductive pattern 220 having the relatively high aluminum concentration. A surface of the first conductive pattern 240 having the relatively low aluminum concentration may be naturally oxidized. However, because the first conductive pattern 240 has a lower aluminum concentration than the second conductive pattern 220, the increase in resistance due to natural oxidation may be reduced. In other words, the work function and the resistance of the gate electrode GE may be individually controlled by providing individual conductive patterns having different aluminum concentrations. Thus, the driving characteristics of the semiconductor device including the gate electrode GE may be improved.

The gate electrode GE may further include a third conductive pattern 260 disposed on the first conductive pattern 240. The third conductive pattern 260 may include, for example, tungsten (W). The gate electrode GE may further include a first barrier pattern 215 disposed between the second conductive pattern 220 and the gate dielectric pattern 210, and a second barrier pattern 255 disposed between the first conductive pattern 240 and the third conductive pattern 260. The first and second barrier patterns 215 and 255 may include a metal nitride. For example, the metal nitride may include titanium (Ti), tantalum (Ta), tungsten (W), ruthenium (Ru), niobium (Nb), molybdenum (Mo), hafnium (Hf), lanthanum (La), or any combination thereof. A thickness of the first barrier pattern 215 may be about 100 Å or less. However, in other embodiments, the second barrier pattern 255 and the third conductive pattern 260 may be omitted.

Figure 3A:
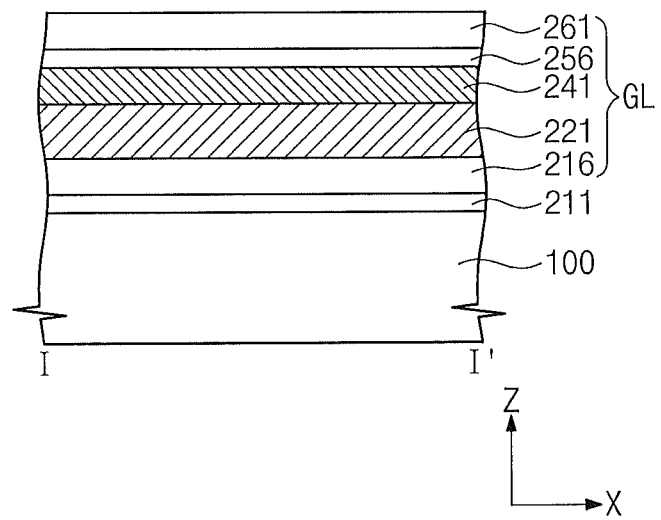
FIGS. 3A and 4A are cross-sectional views taken along a line I-I' of FIG. 1 to illustrate a method of manufacturing a semiconductor device according to some embodiments of the inventive concepts.
Figure 3B:
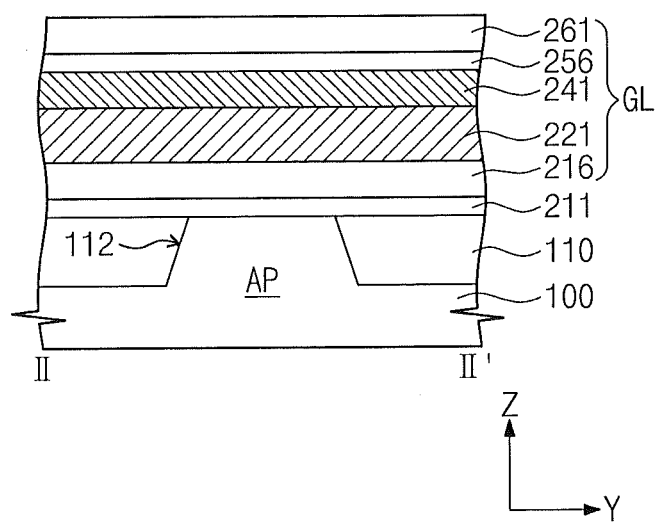
FIGS. 3B and 4B are cross-sectional views taken along a line II-II' of FIG. 1 to illustrate a method of manufacturing a semiconductor device according to some embodiments of the inventive concepts.
Figure 4A:
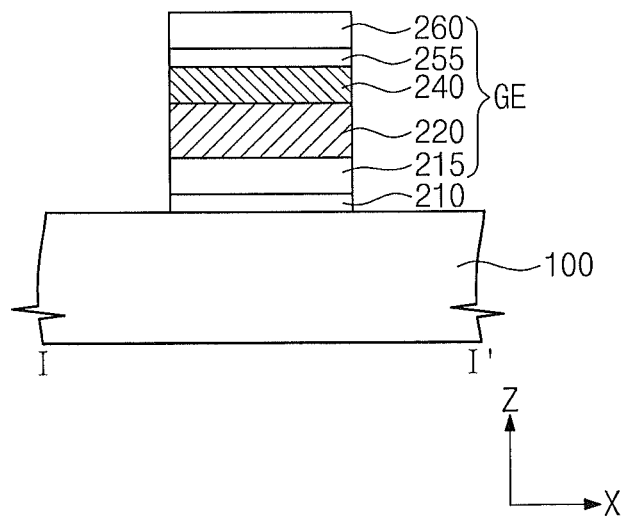
Figure 4B:
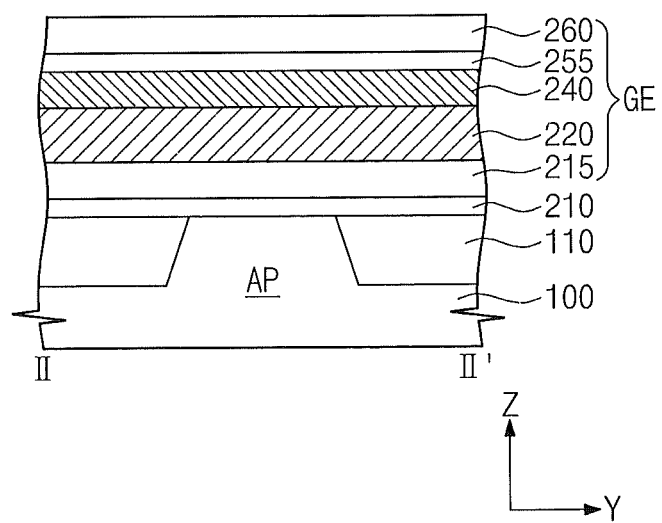
Figure 5:
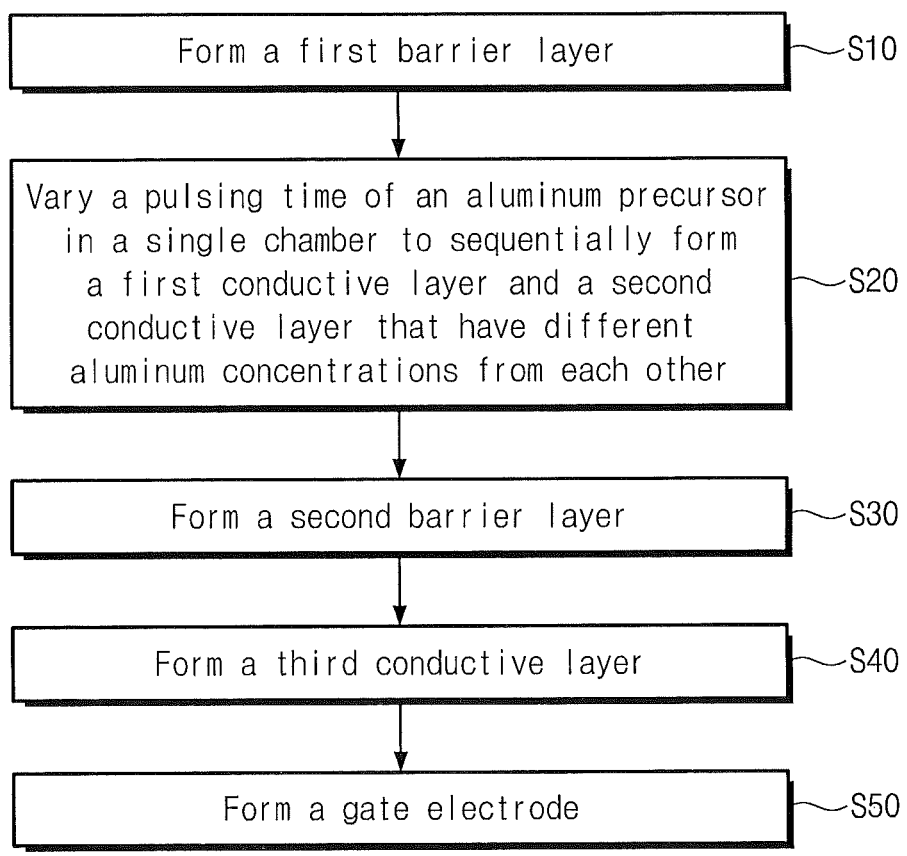
FIG. 5 is a flowchart illustrating a method of manufacturing a gate electrode according to embodiments of the inventive concepts.

FIGS. 3A and 4A are cross-sectional views taken along a line I-I' of FIG. 1 to illustrate methods of manufacturing a semiconductor device according to some embodiments of the inventive concepts. FIGS. 3B and 4B are cross-sectional views taken along a line II-II' of FIG. 1 to illustrate methods of manufacturing a semiconductor device according to some embodiments of the inventive concepts. FIG. 5 is a flowchart illustrating methods of manufacturing a gate electrode according to embodiments of the inventive concepts.

Referring to FIGS. 3A, 3B and 5, first, a substrate 100 may be provided. The substrate 100 may be a silicon substrate or a silicon-on-insulator (SOI) substrate, for example. The substrate 100 may be patterned to form trenches 112 defining an active pattern AP in the substrate 100. In some embodiments, each of the trenches 112 may be formed to narrow toward its bottom surface. Thus, the active pattern AP may be formed to narrow toward its top surface. Thereafter, device isolation patterns 110 may be formed to fill the trenches 112.

A gate dielectric layer 211 may be formed on an entire surface of the substrate 100. The gate dielectric layer 211 may include at least one of high-k dielectric layers. For example, the gate dielectric layer 211 may include at least one of a hafnium oxide layer, a hafnium silicate layer, a zirconium oxide layer, or a zirconium silicate layer, etc. However, the inventive concepts are not limited to these materials of the gate dielectric layer 211. The gate dielectric layer 211 may be formed by, for example, an atomic layer deposition (ALD) process.

A first barrier layer 216 may be formed on the gate dielectric layer 211 (S10). The first barrier layer 216 may be a metal nitride layer. The metal nitride layer of the first barrier layer 216 may include titanium (Ti), tantalum (Ta), tungsten (W), ruthenium (Ru), niobium (Nb), molybdenum (Mo), hafnium (Hf), lanthanum (La), or any combination thereof.

A first conductive layer 221 and a second conductive layer 241 may be sequentially formed on the first barrier layer 216 (S20). The first conductive layer 221 may be formed on the first barrier layer 216 and the second conductive layer 241 may be formed on the first conductive layer 221. The first conductive layer 221 and the second conductive layer 241 may include aluminum (Al) and a metal carbide. The metal carbide may be a compound of carbon (C) and at least one of titanium (Ti), tantalum (Ta), tungsten (W), ruthenium (Ru), niobium (Nb), molybdenum (Mo), hafnium (Hf), and lanthanum (La).

The first conductive layer 221 and the second conductive layer 241 may be formed by performing an atomic layer deposition (ALD) process. The first conductive layer 221 and a second conductive layer 241 may be sequentially formed in a single chamber. During the ALD process, a pulsing time of an aluminum precursor may be varied to form the first and second conductive layers 221 and 241 having different aluminum concentrations from each other. In more detail, a pulsing time of the aluminum precursor for the formation of the first conductive layer 221 may be longer than a pulsing time of the aluminum precursor for the formation of the second conductive layer 241. In other words, the first conductive layer 221 may be formed to have the aluminum concentration higher than that of the second conductive layer 241. In some embodiments, a difference between the aluminum concentrations of the first and second conductive layers 221 and 241 may be about 4 at % or more.

The first conductive layer 221 may be thicker than the second conductive layer 241. In some embodiments, a sum of thicknesses of the first and second conductive layers 221 and 241 may be about 60 Å or less.

A second barrier layer 256 may be formed on the second conductive layer 241 (S30). The second barrier layer 256 may be a metal nitride layer. For example, the metal nitride layer of the second barrier layer 256 may include titanium (Ti), tantalum (Ta), tungsten (W), ruthenium (Ru), niobium (Nb), molybdenum (Mo), hafnium (Hf), lanthanum (La), or any combination thereof.

A third conductive layer 261 may be formed on the second barrier layer 256 (S40). The third conductive layer 261 may include, for example, tungsten (W). The third conductive layer 261 may be formed by performing a chemical vapor deposition (CVD) process.

In some embodiments, the first barrier layer 216, the first conductive layer 221, the second conductive layer 241, the second barrier layer 256, and the third conductive layer 261 that are sequentially stacked may constitute a gate layer GL. However, in other embodiments, the second barrier layer 256 and the third conductive layer 261 may be omitted.

Referring to FIGS. 4A, 4B and 5, the gate dielectric layer 211 and the gate layer GL that are sequentially stacked on the substrate 100 may be patterned to form a gate dielectric pattern 210 and a gate electrode pattern (S50). The gate electrode GE may include a first conductive pattern 240 on the gate dielectric pattern 210, a second conductive pattern 220 between the gate dielectric pattern 210 and the first conductive pattern 240, a first barrier pattern 215 between the gate dielectric pattern 210 and the second conductive pattern 220, a third conductive pattern 260 on the first conductive pattern 240, and a second barrier pattern 255 between the first conductive pattern 240 and the third conductive pattern 260. However, in other embodiments, the gate electrode may not include the second barrier pattern 255 and the third conductive pattern 260.

Referring again to FIGS. 2A and 2B, source/drain regions SD may be formed on opposite sides of the gate electrode GE, respectively. In some embodiments, forming the source/drain regions SD may include removing portions of the active pattern AP at both sides of the gate electrode GE, and performing an epitaxial process on the substrate 100. In some embodiments, the source/drain regions SD may include at least one of silicon-germanium (SiGe), germanium (Ge), silicon (Si), and silicon carbide (SiC) that are epitaxially grown from the substrate 100. Another portion of the active pattern AP under the gate electrode GE may become a channel region CHR disposed between the source/drain regions SD. The source/drain regions SD may be doped with dopants during the epitaxial process or after the epitaxial process.

Even though not shown in the drawings, an insulating layer may be formed on the resultant structure including the gate electrode GE and the source/drain regions SD. Contact holes may be formed to penetrate the insulating layer. The contact holes may expose the source/drain regions SD. Contact plugs may be formed to fill the contact holes. Interconnections connected to the contact plugs may be formed on the insulating layer. As a result, the interconnections on the insulating layer may be electrically connected to the source/drain regions SD through the contact plugs.

According to some embodiments of the inventive concepts, the pulsing time of the aluminum precursor may be varied during the ALD process for the formation of the first and second conductive layers 221 and 241, so that the aluminum concentrations of the first and second conductive layers 221 and 241 may be controlled to be different from each other. In other words, the first and second conductive layers 221 and 241 having different aluminum concentrations from each other may be sequentially formed in the single chamber, so that manufacturing processes of the semiconductor device may be simplified.

Figure 6:
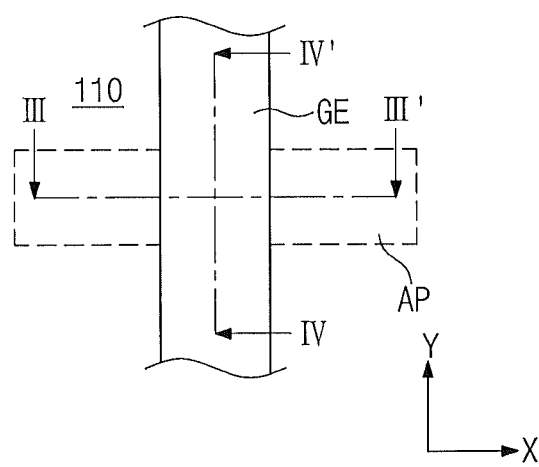
FIG. 6 is a plan view illustrating a semiconductor device according to other embodiments of the inventive concepts.
Figure 7A:
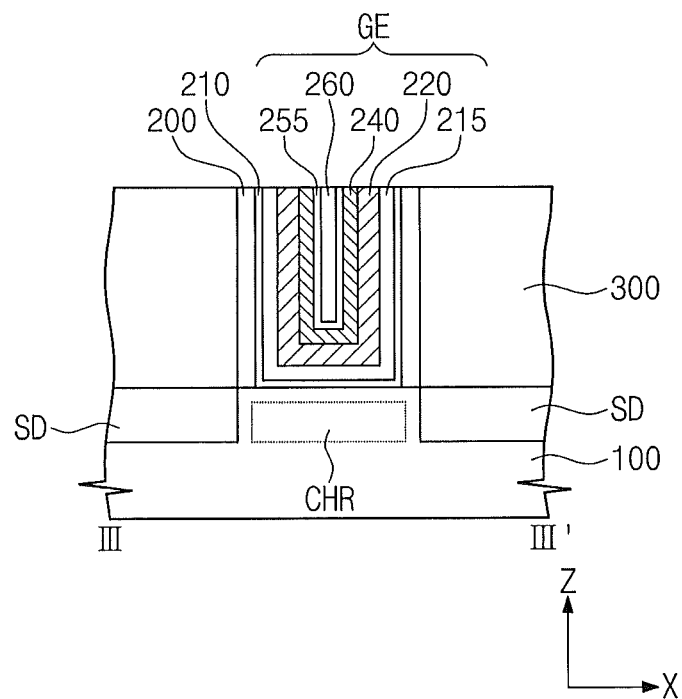
FIGS. 7A and 7B are cross-sectional views taken along lines III-III' and IV-IV' of FIG. 6, respectively.
Figure 7B:
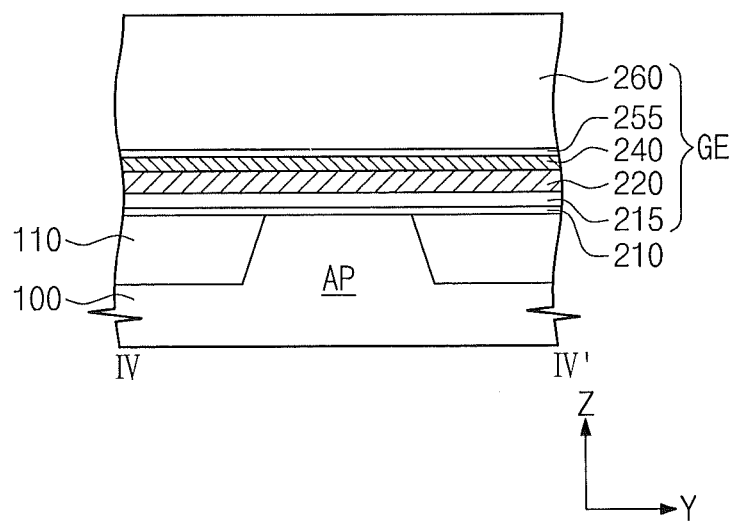

FIG. 6 is a plan view illustrating a semiconductor device according to other embodiments of the inventive concepts, and FIGS. 7A and 7B are cross-sectional views taken along lines III-III' and IV-IV' of FIG. 6, respectively. In these embodiments, the same elements as described in the above embodiment of FIGS. 1, 2A, and 2B will be indicated by the same reference numerals or the same reference designators. The descriptions to the same elements as in the above embodiment of FIGS. 1, 2A, and 2B will be omitted or mentioned briefly for the purpose of ease and convenience in explanation.

Referring to FIGS. 6, 7A and 7B, device isolation patterns 110 may be disposed on or in a substrate 100 to define an active pattern AP. A gate electrode GE may be disposed to cross over the active pattern AP on the substrate 100. The active pattern AP may include a channel region CHR disposed under the gate electrode GE. Source/drain regions SD may be disposed in the active pattern AP at opposing sides of the gate electrode GE.

An interlayer insulating layer 300 may be disposed on the source/drain regions SD. The interlayer insulating layer 300 may cover opposing sidewalls of the gate electrode GE. A gate spacer 200 may be disposed between the interlayer insulating layer 300 and each of the opposing sidewalls of the gate electrode GE.

A gate dielectric pattern 210 may be disposed between the gate electrode GE and the channel region CHR. The gate dielectric pattern 210 may extend along inner sidewalls of the gate spacer 200 to be disposed between the gate electrode GE and the gate spacer 200, so that the gate dielectric pattern 210 may have a U-shaped cross-section. The gate dielectric pattern 210 may extend along a bottom surface of the gate electrode GE.

The gate electrode GE may include a first conductive pattern 240 on the gate dielectric pattern 210 and a second conductive pattern 220 between the gate dielectric pattern 210 and the first conductive pattern 240. The gate dielectric pattern 210 may be disposed between the second conductive pattern 220 and the channel region CHR and between the second conductive pattern 220 and the gate spacer 200. The second conductive pattern 220 may extend along a top surface of the gate dielectric pattern 210 and along inner side surfaces of the gate dielectric pattern, so that the second conductive pattern 220 may also have a U-shaped cross-section. The first conductive pattern 240 may be disposed on the second conductive pattern 220 and may extend along a top surface of the second conductive pattern 220 and along inner side surfaces of the second conductive pattern 220, so that the first conductive pattern 240 may also have a U-shaped cross-section. The first conductive pattern 240 may be in contact with the second conductive pattern 220. Topmost surfaces of the gate dielectric pattern 210, the second conductive pattern 220 and the first conductive pattern 240 may be substantially coplanar with a top surface of the interlayer dielectric layer 300.

The first conductive pattern 240 and the second conductive pattern 220 may include aluminum (Al) and a metal carbide. The metal carbide may be a compound of carbon (C) and at least one of titanium (Ti), tantalum (Ta), tungsten (W), ruthenium (Ru), niobium (Nb), molybdenum (Mo), hafnium (Hf), and lanthanum (La).

An aluminum concentration of the second conductive pattern 220 may be higher than an aluminum concentration of the first conductive pattern 240, and the second conductive pattern 220 may be thicker than the first conductive pattern 240.

The gate electrode GE may further include a third conductive pattern 260 disposed on the first conductive pattern 240. The third conductive pattern 260 may include, for example, tungsten (W). The gate electrode GE may further include a first barrier pattern 215 between the second conductive pattern 220 and the gate dielectric pattern 210, and a second barrier pattern 225 between the first conductive pattern 240 and the third conductive pattern 260. The first barrier pattern 215 may extend along the top surface of the gate dielectric pattern 210, and the second barrier pattern 255 may extend along the top surface of the first conductive pattern 240. A bottom surface and opposing sidewalls of the third conductive pattern 260 may be in contact with the second barrier pattern 255. A top surface of the third conductive pattern 260 may be substantially coplanar with a top surface of the interlayer insulating layer 300. The gate dielectric pattern 210, the first barrier pattern 215, the second conductive pattern 220, and the first conductive pattern 240 may be sequentially stacked between the channel region CHR and the second barrier pattern 255. Additionally, the gate dielectric pattern 210, the first barrier pattern 215, the second conductive pattern 220, and the first conductive pattern 240 may also be sequentially stacked between the gate spacer 200 and the second barrier pattern 255. However, in other embodiments, the second barrier pattern 255 and the third conductive pattern 260 may be omitted. In this case, a top surface of the first conductive pattern 240 may be substantially coplanar with the top surface of the interlayer insulating layer 300.

Figure 8A:
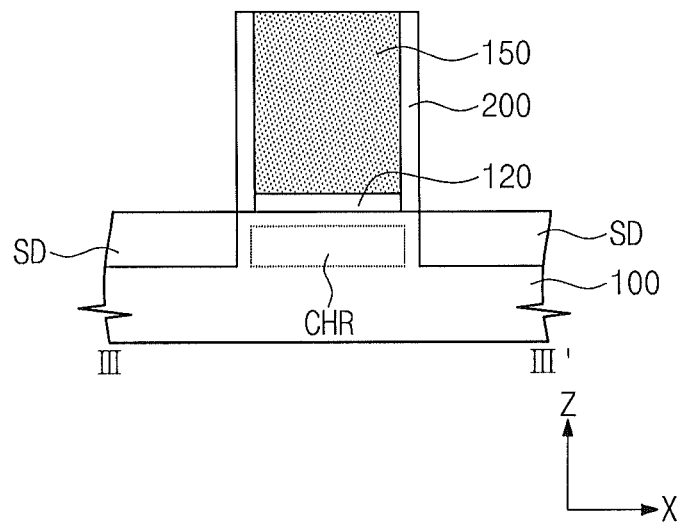
FIGS. 8A and 9A are cross-sectional views taken along a line III-III' of FIG. 6 to illustrate a method of manufacturing a semiconductor device according to other embodiments of the inventive concepts.
Figure 8B:
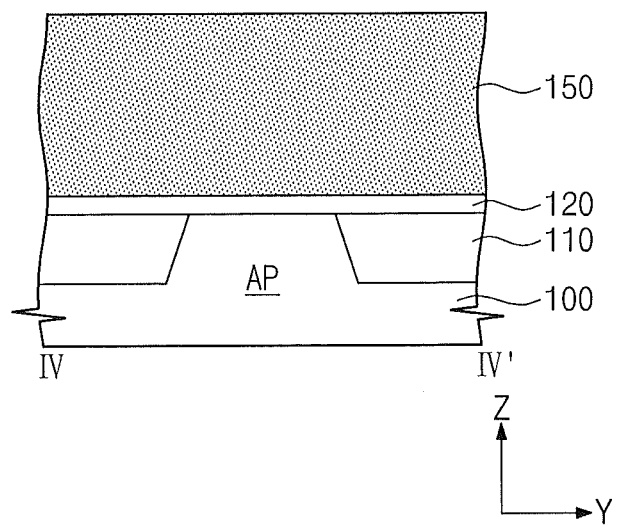
FIGS. 8B and 9B are cross-sectional views taken along a line IV-IV' of FIG. 6 to illustrate a method of manufacturing a semiconductor device according to other embodiments of the inventive concepts.
Figure 9A:
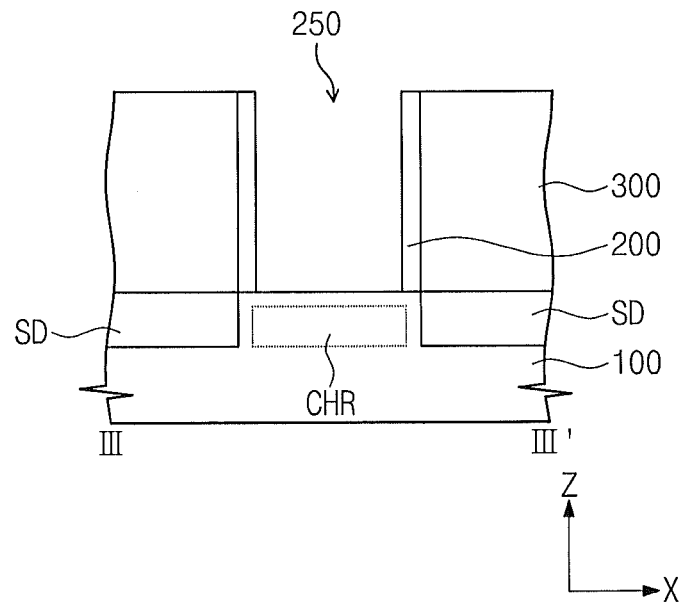
Figure 9B:
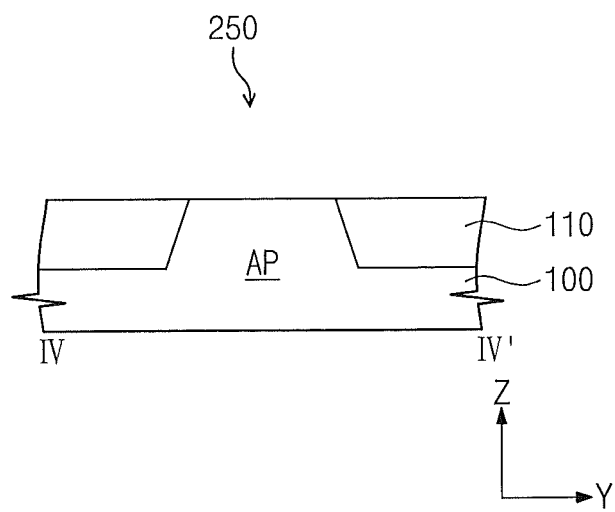

FIGS. 8A and 9A are cross-sectional views taken along a line III-III' of FIG. 6 to illustrate methods of manufacturing a semiconductor device according to other embodiments of the inventive concepts. FIGS. 8B and 9B are cross-sectional views taken along a line IV-IV' of FIG. 6 to illustrate methods of manufacturing a semiconductor device according to other embodiments of the inventive concepts. In these embodiments, the same elements as described in the method of manufacturing the semiconductor device of FIGS. 5, 3A, 3B, 4A, and 4B will be indicated by the same reference numerals or the same reference designators. The descriptions to the same elements as in the embodiment of FIGS. 5, 3A, 3B, 4A, and 4B will be omitted or mentioned briefly for the purpose of ease and convenience in explanation.

Referring to FIGS. 8A and 8B, a sacrificial gate pattern 150 may be formed to cross over an active pattern AP on a substrate 100. First, an etch stop layer and a sacrificial gate layer may be sequentially formed on the substrate 100. The etch stop layer may include, for example, an oxide layer. The sacrificial gate layer may include, for example, a poly-crystalline silicon layer. However, the inventive concepts are not limited to these materials of the etch stop layer and the sacrificial gate layer. The sacrificial gate layer may be patterned to form the sacrificial gate pattern 150. The sacrificial gate pattern 150 may be formed using an etching process having an etch selectivity with respect to the etch stop layer.

After the formation of the sacrificial gate pattern 150, the etch stop layer at both sides of the sacrificial gate pattern 150 may be removed to form an etch stop pattern 120 under the sacrificial gate pattern 150. The etch stop pattern 120 may extend along a bottom surface of the sacrificial gate pattern 150.

A gate spacer layer may be formed on the resultant structure including the sacrificial gate pattern 150, and then the gate spacer layer may be etched to form gate spacers 200 on both sidewalls of the sacrificial gate pattern 150, respectively.

Source/drain regions SD may be formed at both sides of the sacrificial gate pattern 150. In some embodiments, forming the source/drain regions SD may include removing portions of the active pattern AP at both sides of the sacrificial gate pattern 150, and performing an epitaxial process on the substrate 100. Another portion of the active pattern AP under the sacrificial gate pattern 150 may become a channel region CHR disposed between the source/drain regions SD. The source/drain regions SD may be doped with dopants during the epitaxial process or after the epitaxial process.

Referring to FIGS. 9A and 9B, an interlayer insulating layer 300 may be formed on the resultant structure including the source/drain regions SD. The interlayer insulating layer 300 may be formed to cover the source/drain regions SD and the sacrificial gate pattern 150. The interlayer insulating layer 300 may include at least one of an oxide layer, a nitride layer, an oxynitride layer, other low-k dielectric layers, or combinations of any of the foregoing. The interlayer insulating layer 300 may be etched to expose a top surface of the sacrificial gate pattern 150. Thereafter, the sacrificial gate pattern 150 may be removed to form a gap region 250 exposing the substrate 100 between the gate spacers 200. Forming the gap region 250 may include etching the sacrificial gate pattern 150 using an etching process having an etch selectivity with respect to the gate spacers 200, the interlayer insulating layer 300 and the etch stop pattern 120. Additionally, forming the gap region 250 may further include removing the etch stop pattern 120 to expose the substrate 100.

Referring again to FIGS. 5, 7A, and 7B, a gate dielectric pattern 210 and a gate electrode GE may be formed to fill the gap region 250. First, a gate dielectric layer may be formed on the resultant structure including the gap region 250. The gate dielectric layer may partially fill the gap region 250. For example, the gate dielectric layer may be formed by performing an ALD process. A first barrier layer may be formed on the gate dielectric layer (S10). The first barrier layer may partially fill the gap region 250.

A first conductive layer and a second conductive layer may be sequentially formed on the first barrier layer (S20). The first conductive layer and the second conductive layer may fill at least a portion of the gap region 250. The first conductive layer and the second conductive layer may be sequentially formed in a single chamber by an ALD process. A detail method of forming the first and second conductive layers may be the same as described with reference to FIGS. 5, 3A, and 3B.

A second barrier layer may be formed on the second conductive layer (S30). The second barrier layer may fill at least a portion of the gap region 250. A third conductive layer may be formed on the second barrier layer (S40). The third conductive layer may fill a residual portion of the gap region 250.

The first barrier layer, the first conductive layer, the second conductive layer, the second barrier layer, and the third conductive layer that are sequentially stacked may constitute a gate layer. However, in other embodiments, the second barrier layer and the third conductive layer may be omitted. In this case, the second conductive layer may fill the residual portion of the gap region 250.

The gate layer and the gate dielectric layer may be planarized to form a gate dielectric pattern 210 and a gate electrode GE (S50). Top surfaces of the interlayer insulating layer 300 and the gate spacers 200 may be exposed by the planarization process. The gate dielectric pattern 210 may extend along a bottom surface of the gate electrode GE and may also be disposed on both sidewalls of the gate electrode GE. The portions of the gate dielectric pattern 210 on the both sidewalls of the gate electrode GE may be disposed between the gate electrode GE and the gate spacers 200. The gate electrode GE may include a first conductive pattern 240 on the gate dielectric pattern 210, a second conductive pattern 220 between the gate dielectric pattern 210 and the first conductive pattern 240, a first barrier pattern 215 between the gate dielectric pattern 210 and the second conductive pattern 220, a third conductive pattern 260 on the first conductive pattern 240, and a second barrier pattern 255 between the first conductive pattern 240 and the third conductive pattern 260.

Figure 10A:
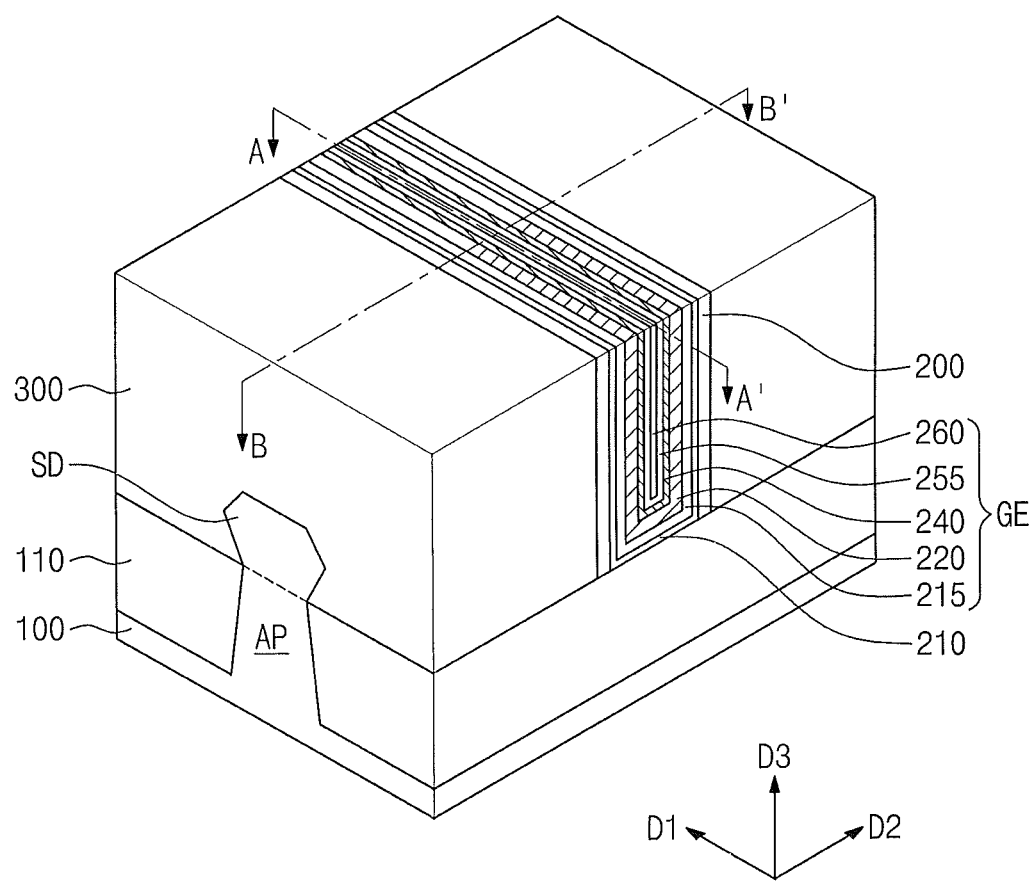
FIG. 10A is a perspective view illustrating a semiconductor device according to still other embodiments of the inventive concepts.
Figure 10B:
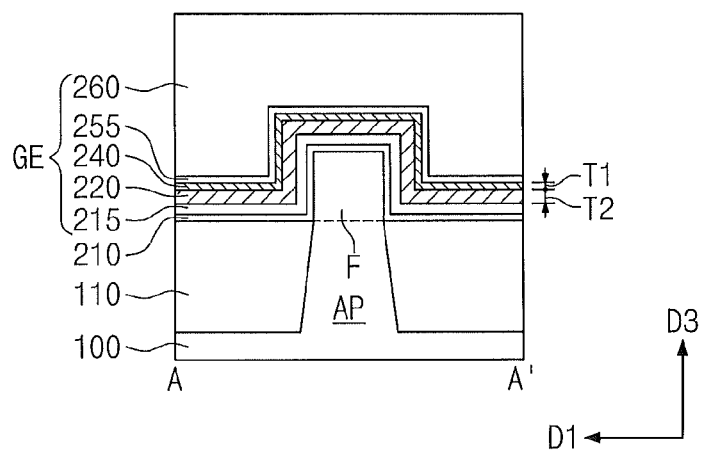
FIGS. 10B and 10C are cross-sectional views taken along lines A-A' and B-B' of FIG. 10A, respectively.
Figure 10C:
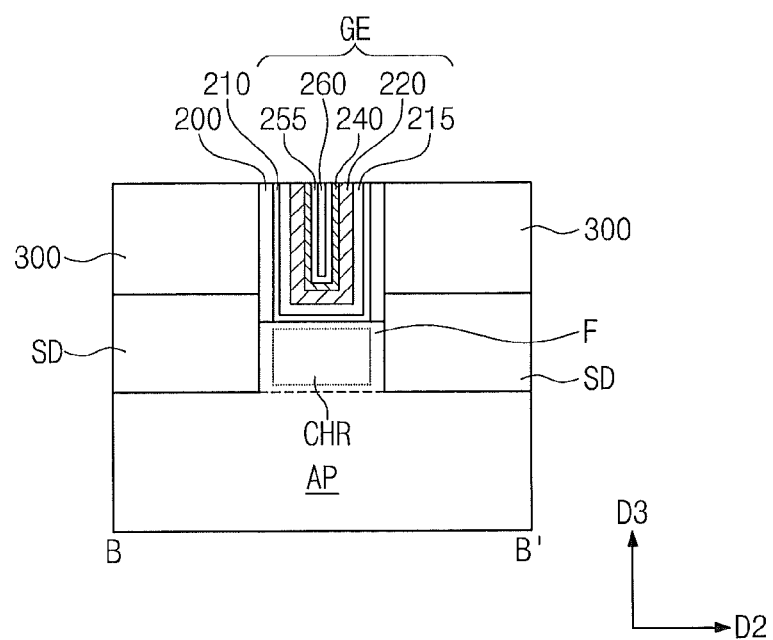

FIG. 10A is a perspective view illustrating a FinFET semiconductor device according to still other embodiments of the inventive concepts, and FIGS. 10B and 10C are cross-sectional views taken along lines A-A' and B-B' of FIG. 10A, respectively. In the present embodiment, the same elements as described with reference to FIGS. 1, 2A, 2B, 6, 7A, and 7B will be indicated by the same reference numerals or the same reference designators, and the descriptions to the same elements in the above embodiments of FIGS. 1, 2A, 2B, 6, 7A and 7B will be omitted or mentioned briefly for the purpose ease and convenience in explanation.

Referring to FIGS. 10A, 10B, and 10C, device isolation patterns 110 may be disposed on or in a substrate 100 to define an active pattern AP. The device isolation patterns 110 may be arranged in a first direction D1 and may have line-shapes extending in a second direction D2 intersecting the first direction D1. The active pattern AP may have a line-shape extending in parallel to the device isolation patterns 110 in the second direction D2.

A gate electrode GE may be disposed to cross over the active pattern AP on the substrate 100. The active pattern AP may include a channel region CHR disposed under the gate electrode GE. The gate electrode may be formed on a top surface and both sidewalls of the channel region CHR. In other words, the channel region CHR may be a portion (i.e., an active fin F) of the active pattern AP that protrudes in a third direction D3 perpendicular to the first and second directions D1 and D2.

Source/drain regions SD epitaxially grown from the active pattern AP may be disposed at both sides of the gate electrode GE. The channel region CHR may have a top surface higher than bottom surfaces of the source/drain regions SD in a vertical view. The channel region CHR may be disposed between the source/drain regions SD in a horizontal view.

An interlayer insulating layer 300 may be disposed on the source/drain regions SD. The interlayer insulating layer 300 may cover both sidewalls of the gate electrode GE. A gate spacer 200 may be disposed between the interlayer insulating layer 300 and each of the both sidewalls of the gate electrode GE.

A gate dielectric pattern 210 may be disposed between the gate electrode GE and the channel region CHR. The gate dielectric pattern 210 may extend to be disposed between the gate electrode GE and the gate spacer 200. The gate dielectric pattern 210 may extend along a bottom surface of the gate electrode GE. The gate dielectric pattern 210 may laterally extend from the channel region CHR to partially cover top surfaces of the device isolation patterns 110. In some embodiments, the top surfaces of the device isolation patterns 110 may have portions that are not covered by the gate dielectric pattern 210. In some embodiments, the top surfaces of the device isolation patterns 110 that are not covered by the gate dielectric pattern 210 may be covered by the interlayer insulating layer 300.

The gate electrode GE may include a first conductive pattern 240 on the gate dielectric pattern 210 and a second conductive pattern 220 between the gate dielectric pattern 210 and the first conductive pattern 240. In some embodiments, the gate dielectric pattern 210 may be disposed between the second conductive pattern 220 and the channel region CHR and between the second conductive pattern 220 and the gate spacer 200. The second conductive pattern 220 may extend along a top surface of the gate dielectric pattern 210. The first conductive pattern 240 may be disposed on the second conductive pattern 220 and may extend along a top surface of the second conductive pattern 220. The first conductive pattern 240 may be in contact with the second conductive pattern 220.

The first conductive pattern 240 and the second conductive pattern 220 may include aluminum (Al) and a metal carbide. The metal carbide may be a compound of carbon (C) and at least one of titanium (Ti), tantalum (Ta), tungsten (W), ruthenium (Ru), niobium (Nb), molybdenum (Mo), hafnium (Hf), and lanthanum (La).

An aluminum concentration of the second conductive pattern 220 may be higher than an aluminum concentration of the first conductive pattern 240. A first thickness T1 of the first conductive pattern 240 may be thinner than a second thickness T2 of the second conductive pattern 220.

The gate electrode GE may further include a third conductive pattern 260 disposed on the first conductive pattern 240. Additionally, the gate electrode GE may further include a first barrier pattern 215 between the second conductive pattern 220 and the gate dielectric pattern 210, and a second barrier pattern 225 between the first conductive pattern 240 and the third conductive pattern 260.

In some embodiments, the first barrier pattern 215 may extend along the top surface of the gate dielectric pattern 210, and the second barrier pattern 255 may extend along the top surface of the first conductive pattern 240. In other words, the gate dielectric pattern 210, the first barrier pattern 215, the second conductive pattern 220, the first conductive pattern 240 and the second barrier pattern 255 may be sequentially stacked to extend along the top surface and the both sidewalls of the channel region CHR and may partially cover the top surfaces of the device isolation patterns 110. A bottom surface and both sidewalls of the third conductive pattern 260 may be in contact with the second barrier pattern 255. A top surface of the third conductive pattern 260 may be substantially coplanar with a top surface of the interlayer insulating layer 300. The gate dielectric pattern 210, the first barrier pattern 215, the second conductive pattern 220, and the first conductive pattern 240 may be sequentially stacked between the channel region CHR and the second barrier pattern 255. Additionally, the gate dielectric pattern 210, the first barrier pattern 215, the second conductive pattern 220, and the first conductive pattern 240 may also be sequentially stacked between the gate spacer 200 and the second barrier pattern 255. However, in other embodiments, the second barrier pattern 255 and the third conductive pattern 260 may be omitted. In this case, a top surface of the first conductive pattern 240 may be substantially coplanar with the top surface of the interlayer insulating layer 300.

FIGS. 11A to 13A are perspective views illustrating methods of manufacturing a semiconductor device according to still other embodiments of the inventive concepts. FIGS. 11B to 13B are cross-sectional views taken along lines A-A' of FIGS. 11A to 13A, respectively. FIGS. 11C to 13C are cross-sectional views taken along lines B-B' of FIGS. 11A to 13A, respectively.

Figure 11A:
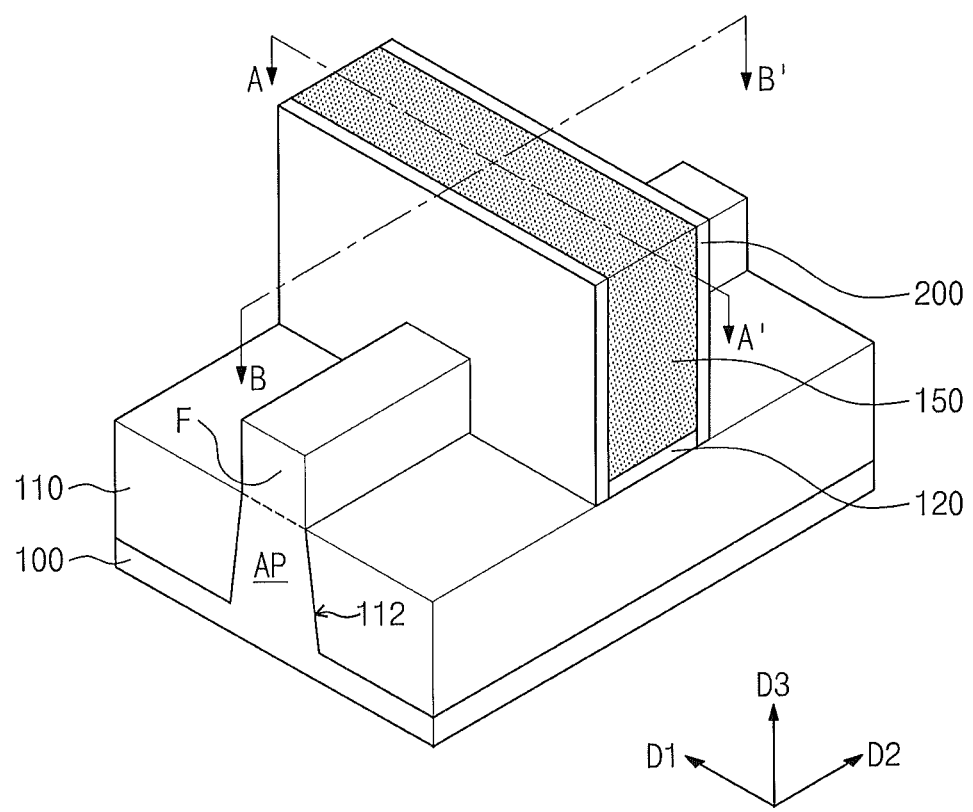
FIGS. 11A, 12A and 13A are perspective views illustrating a method of manufacturing a semiconductor device according to still other embodiments of the inventive concepts.
Figure 11B:
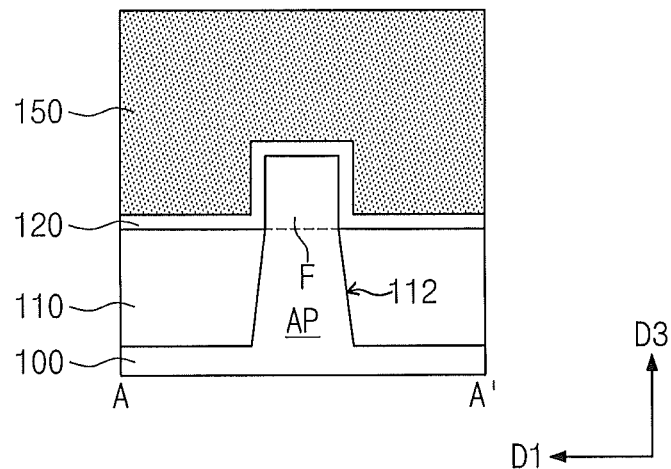
FIGS. 11B, 12B and 13B are cross-sectional views taken along lines A-A' of FIGS. 11A, 12A and 13A, respectively.
Figure 11C:
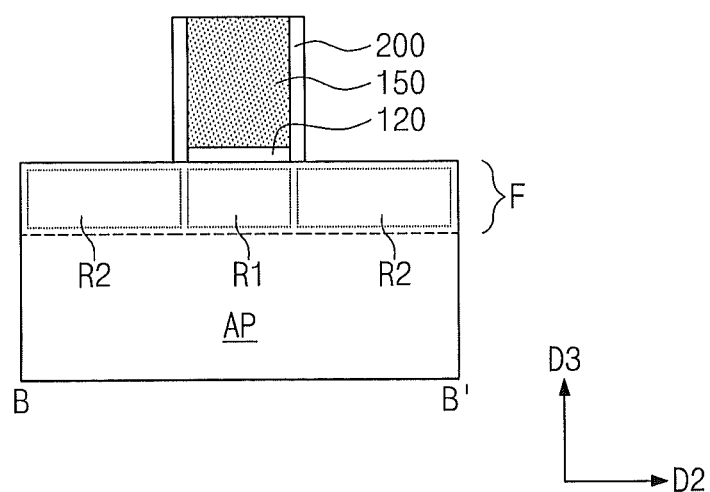
FIGS. 11C, 12C and 13C are cross-sectional views taken along lines B-B' of FIGS. 11A, 12A and 13A, respectively.

Referring to FIGS. 11A, 11B, and 11C, a substrate 100 may be etched to form trenches 112 defining an active pattern AP in the substrate 100. In more detail, a mask pattern may be formed on the substrate 100 and then the substrate 100 may be anisotropically etched using the mask pattern as an etch mask, thereby forming the trenches 112. In some embodiments, each of the trenches 112 may be formed to narrow toward a bottom surface thereof. Thus, the active pattern AP may be formed to narrow toward a top surface thereof.

Device isolation patterns 110 may be formed to fill the trenches 112. A device isolation layer may be formed on the substrate 100 to fill the trenches 112 and then the device isolation layer may be planarized until a top surface of the mask pattern is exposed, thereby forming the device isolation patterns 110.

Top surfaces of the device isolation patterns 110 may be recessed to expose an upper portion (hereinafter, referred to as 'an active fin F') of the active pattern AP. The top surfaces of the device isolation patterns 110 may be recessed using an etching process having an etch selectivity with respect to the active pattern AP. The mask pattern may be removed during the etching process of recessing the top surfaces of the device isolation patterns 110. Thus, a top surface of the active fin F may be exposed.

A sacrificial gate pattern 150 may be formed to cross over the active fin F on a substrate 100. First, an etch stop layer and a sacrificial gate layer may be sequentially formed on the substrate 100. The sacrificial gate layer may be patterned to form the sacrificial gate pattern 150. The sacrificial gate pattern 150 may be formed using an etching process having an etch selectivity with respect to the etch stop layer. Since the sacrificial gate pattern 150 is formed to cross over the active fin F, a first region R1 and second regions R2 may be defined in the active fin F. The first region R1 is a portion of the active fin F disposed under the sacrificial gate pattern 150. The first region R1 vertically overlaps with the sacrificial gate pattern 150. The second regions R2 are other portions of the active fin F. The second regions R2 are disposed at both sides of the sacrificial gate pattern 150 and are horizontally separated from each other by the first region R1.

After the formation of the sacrificial gate pattern 150, the etch stop layer at both sides of the sacrificial gate pattern 150 may be removed to form an etch stop pattern 120 under the sacrificial gate pattern 150. The etch stop pattern 120 may extend along a bottom surface of the sacrificial gate pattern 150 to cover a top surface and sidewalls of the active fin F. Since the etch stop layer at both sides of the sacrificial gate pattern 150 is removed, the second regions R2 of the active fin F may be exposed.

Thereafter, gate spacers 200 may be disposed on both sidewalls of the sacrificial gate pattern 150, respectively. A gate spacer layer may be formed on the resultant structure including the sacrificial gate pattern 150 and then the gate spacer layer may be etched to expose top surfaces of the device isolation patterns 110. During the etching process of the gate spacer layer, top surfaces of the second regions R2 may be exposed. Additionally, both sidewalls of the second regions R2 may also be exposed during the etching process of the gate spacer layer.

Figure 12A:
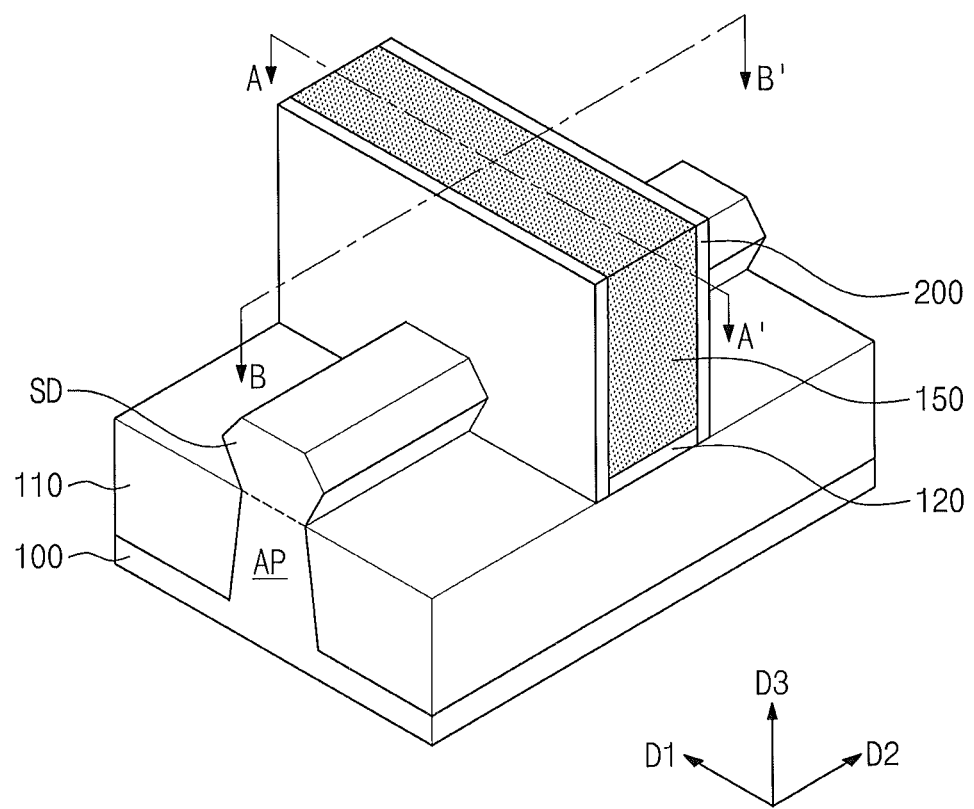
Figure 12B:
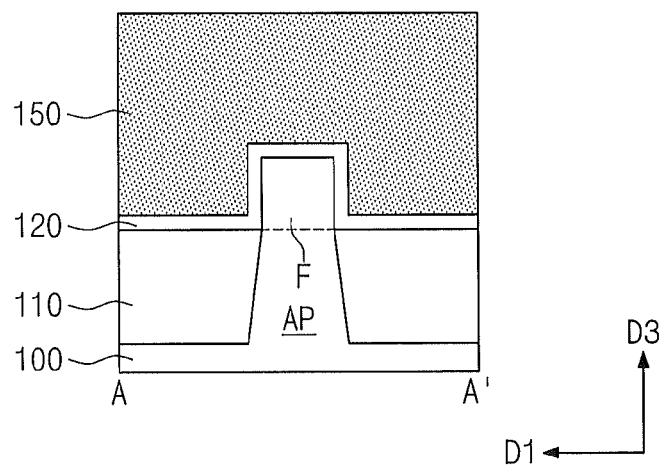
Figure 12C:
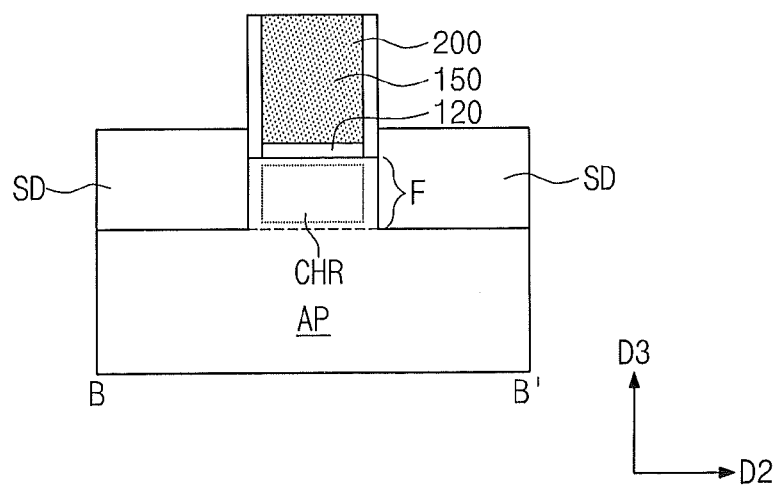

Referring to FIGS. 12A, 12B, and 12C, source/drain regions SD may be formed at both sides of the sacrificial gate pattern 150. The source/drain regions SD may be formed at positions of the second regions R2. Thus, the first region R1 may become a channel region CHR disposed between the source/drain regions SD.

Forming the source/drain regions SD may include removing the second regions R2, and performing an epitaxial process on the substrate 100. In some embodiments, the source/drain regions SD may include at least one of silicon-germanium (SiGe), germanium (Ge), silicon (Si) and silicon carbide (SiC) epitaxially grown from the substrate 100. The source/drain regions SD may be doped with dopants during the epitaxial process or after the epitaxial process.

Figure 13A:
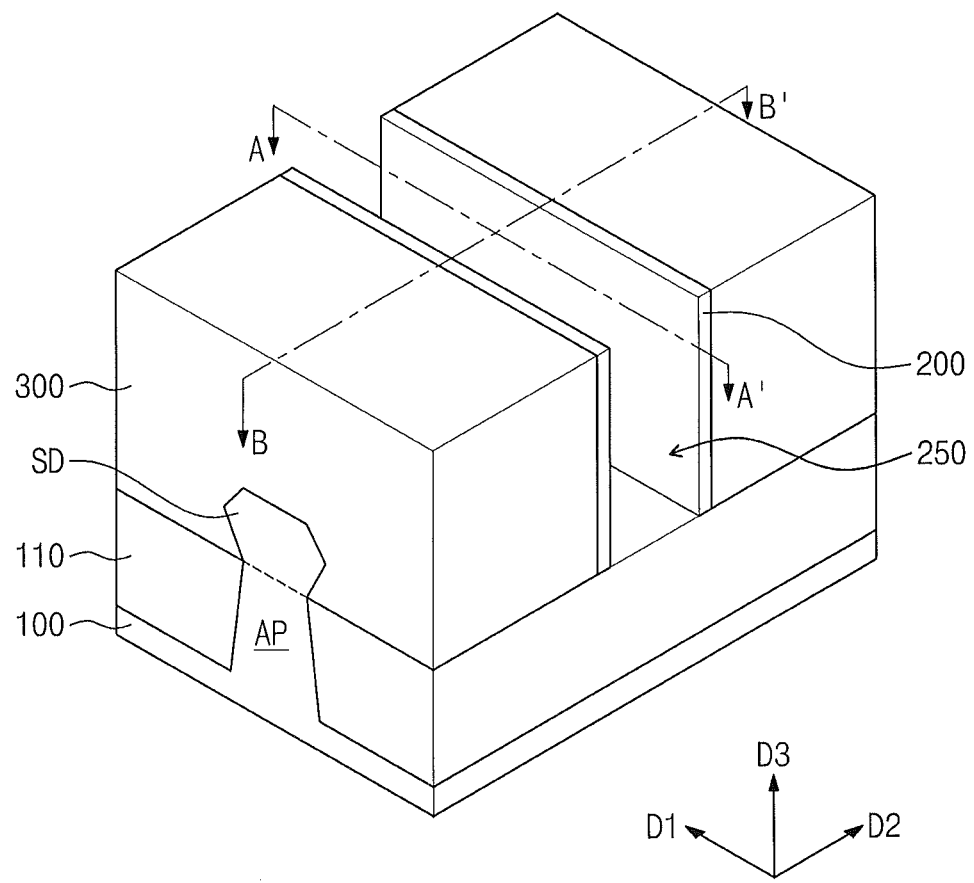
Figure 13B:
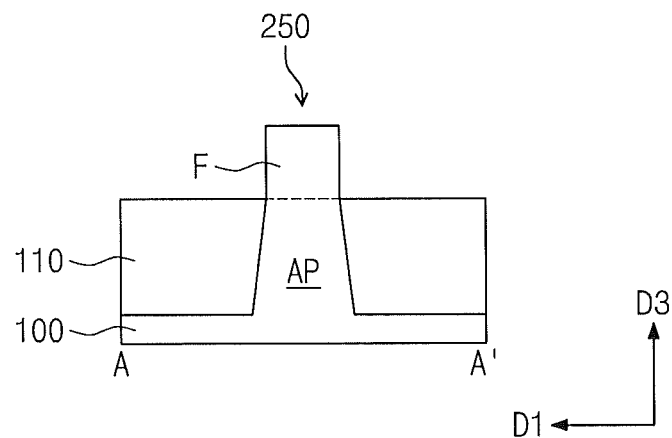
Figure 13C:
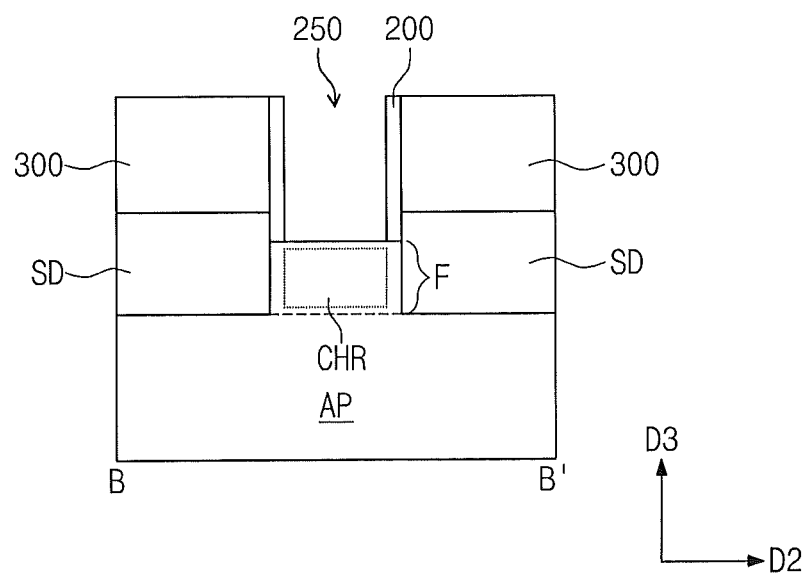

Referring to FIGS. 13A, 13B, and 13C, an interlayer insulating layer 300 may be formed on the resultant structure including the source/drain regions SD. The interlayer insulating layer 300 may be formed to cover the source/drain regions SD and the sacrificial gate pattern 150. The interlayer insulating layer 300 may be etched to expose a top surface of the sacrificial gate pattern 150. Thereafter, the sacrificial gate pattern 150 may be removed to form a gap region 250 exposing the active fin F between the gate spacers 200. Forming the gap region 250 may include etching the sacrificial gate pattern 150 using an etching process having an etch selectivity with respect to the gate spacers 200, the interlayer insulating layer 300 and the etch stop pattern 120. Additionally, forming the gap region 250 may further include removing the etch stop pattern 120 to expose the active fin F.

Referring again to FIGS. 5, 10A, 10B, and 10C, a gate dielectric pattern 210 and a gate electrode GE may be formed to fill the gap region 250. First, a gate dielectric layer may be formed to partially fill the gap region 250 on the resultant structure including the gap region 250. The gate dielectric layer may be formed to cover the active fin F. A first barrier layer may be formed on the gate dielectric layer (S10). The first barrier layer may partially fill the gap region 250.

A first conductive layer and a second conductive layer may be sequentially formed on the first barrier layer (S20). The first conductive layer and the second conductive layer may fill at least a portion of the gap region 250. The first conductive layer and the second conductive layer may be sequentially formed in a single chamber by an ALD process. A detail method of forming the first and second conductive layers may be the same as described with reference to FIGS. 5, 3A, and 3B.

A second barrier layer may be formed on the second conductive layer (S30). The second barrier layer may fill at least a portion of the gap region 250. A third conductive layer may be formed on the second barrier layer (S40). The third conductive layer may fill a residual portion of the gap region 250.

The first barrier layer, the first conductive layer, the second conductive layer, the second barrier layer, and the third conductive layer that are sequentially stacked may constitute a gate layer. However, in other embodiments, the second barrier layer and the third conductive layer may be omitted. In this case, the second conductive layer may fill a residual portion of the gap region 250.

The gate layer and the gate dielectric layer may be planarized to form a gate dielectric pattern 210 and a gate electrode GE (S50). The gate dielectric pattern 210 may extend along a bottom surface of the gate electrode GE and may also be disposed on both sidewalls of the gate electrode GE. The portions of the gate dielectric pattern 210 on the both sidewalls of the gate electrode GE may be disposed between the gate electrode GE and the gate spacers 200. The gate electrode GE may include a first conductive pattern 240 on the gate dielectric pattern 210, a second conductive pattern 220 between the gate dielectric pattern 210 and the first conductive pattern 240, a first barrier pattern 215 between the gate dielectric pattern 210 and the second conductive pattern 220, a third conductive pattern 260 on the first conductive pattern 240, and a second barrier pattern 255 between the first conductive pattern 240 and the third conductive pattern 260.

According to the inventive concepts, the gate electrode GE may include the first and second conductive patterns 240 and 220 having different aluminum concentrations from each other. The work function of the gate electrode GE may be lowered by the second conductive pattern 220 having the relatively high aluminum concentration, and the resistance of the gate electrode GE may be reduced by the first conductive pattern 240 having the relatively low aluminum concentration. In other words, the work function and the resistance of the gate electrode GE may be individually controlled by the individual conductive patterns having different aluminum concentrations from each other, so that the driving characteristics of the semiconductor device including the gate electrode GE may be improved.

Furthermore, according to inventive concepts, the pulsing time of the aluminum precursor may be varied during the ALD process of forming the first conductive layer and the second conductive layer, so that the aluminum concentrations of the first and second conductive layers may be controlled differently from each other. In other words, the first and second conductive layers having different aluminum concentrations may be sequentially formed in the single chamber such that the manufacturing processes of the semiconductor device may be simplified.

Figure 14:
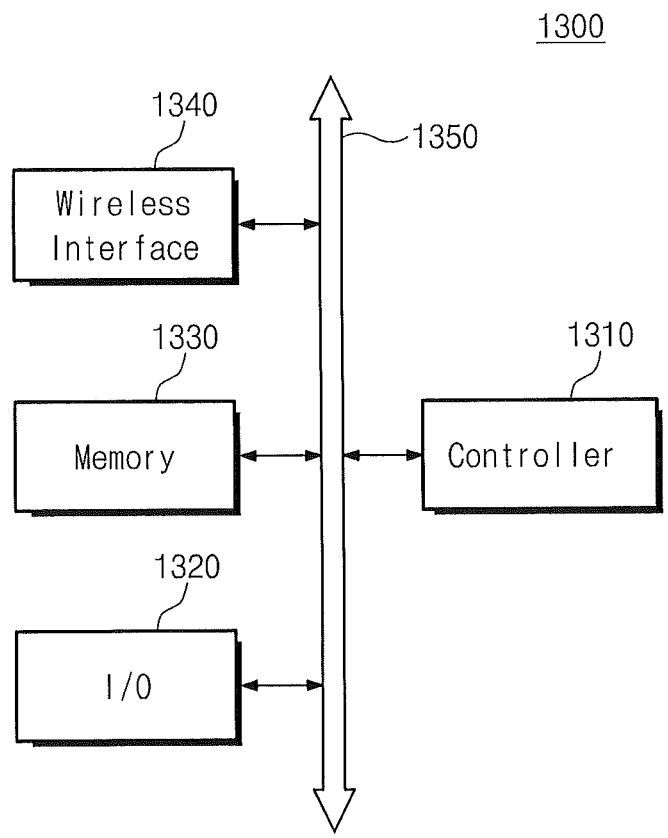
FIGS. 14 and 15 are schematic block diagrams illustrating electronic devices including semiconductor devices according to embodiments of the inventive concepts.
Figure 15:
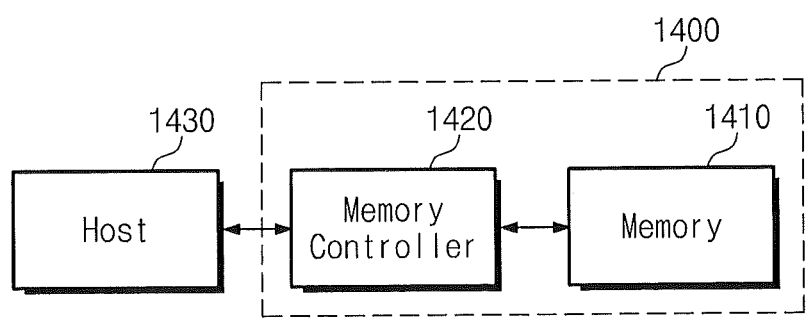

FIGS. 14 and 15 are schematic block diagrams illustrating electronic devices including semiconductor devices according to embodiments of the inventive concepts.

Referring to FIG. 14, an electronic device 1300 including the semiconductor device according to embodiments of the inventive concepts may be one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 that are coupled to each other through a data bus 1350. For example, the controller 1310 may include at least one of a microprocessor, a digital signal processor, a microcontroller, or another logic device having a similar function to any one thereof. For example, the memory device 1330 may store commands executed through the controller 1310. Additionally, the memory device 1330 may store user's data. The memory device 1330 may include at least one of the semiconductor devices in the aforementioned embodiments of the inventive concepts. The electronic device 1300 may use the wireless interface unit 1340 in order to transmit data to a wireless communication network communicating with a radio frequency (RF) signal or in order to receive data from the network. For example, the wireless interface unit 1340 may include antenna or a wireless transceiver. The electronic device 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS.

Referring to FIG. 15, the semiconductor devices according to embodiments of the inventive concepts may be used in order to realize memory systems. A memory system 1400 may include a memory device 1410 and a memory controller 1420 for storing massive data. The memory controller 1420 may control the memory device 1410 in order to read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to the above embodiments of the inventive concepts.

A package in which the semiconductor device according to one of the above embodiments is mounted may further include a controller and/or a logic device for controlling the semiconductor device.

According to the inventive concepts, the gate electrode may include the first and second conductive patterns having different aluminum concentrations from each other. The work function of the gate electrode may be lowered by the second conductive pattern having the relatively high aluminum concentration, and the resistance of the gate electrode may be reduced by the first conductive pattern having the relatively low aluminum concentration. In other words, the work function and the resistance of the gate electrode may be individually controlled by the individual conductive patterns having different aluminum concentrations from each other, so that the driving characteristics of the semiconductor device including the gate electrode may be improved.

Additionally, the individual conductive patterns having different aluminum concentrations may be sequentially formed in the single chamber by the ALD process. Thus, the manufacturing processes of the semiconductor device may be simplified.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a gate dielectric pattern on a substrate; and
a gate electrode on the gate dielectric pattern opposite the substrate, wherein the gate electrode comprises:
a first conductive pattern on the gate dielectric pattern, the first conductive pattern comprising aluminum;
a second conductive pattern disposed between the first conductive pattern and the gate dielectric pattern, the second conductive pattern comprising aluminum and having an aluminum concentration that is higher than an aluminum concentration of the first conductive pattern; and
a third conductive pattern on the first conductive pattern; and
a barrier pattern between the first conductive pattern and the third conductive pattern,
wherein the first conductive pattern is disposed between the second conductive pattern and the third conductive pattern; and
wherein the barrier pattern comprises titanium (Ti), tantalum (Ta), tungsten (W), ruthenium (Ru), niobium (Nb), molybdenum (Mo), hafnium (Hf), lanthanum (La), or any combination thereof.

2. The semiconductor device of claim 1, further comprising:
gate spacers disposed on respective opposing sidewalk of the gate electrode,
wherein the gate dielectric pattern extends along inner sidewalls of the gate spacers to be disposed between the second conductive pattern and the gate spacers; and
wherein the second conductive pattern extends along inner sidewalls of the gate dielectric pattern to be disposed between the first conductive pattern and the gate spacers.

3. The semiconductor device of claim 1, further comprising:
an active fin protruding from the substrate in a direction vertical to a top surface of the substrate,
wherein the gate electrode crosses over the active fin; and
wherein the gate dielectric pattern extends along a bottom surface of the gate electrode to cover a top surface and sidewalk of the active fin.

4. The semiconductor device of claim 1, wherein the first conductive pattern further comprises a first metal carbide and the second conductive pattern further comprises a second metal carbide.

5. A semiconductor device comprising
a gate dielectric pattern on a substrate; and
a gate electrode on the gate dielectric pattern opposite the substrate, wherein the gate electrode comprises:
a first conductive pattern on the gate dielectric pattern, the first conductive pattern comprising aluminum;
a second conductive pattern disposed between the first conductive pattern and the gate dielectric pattern, the second conductive pattern comprising aluminum, having an aluminum concentration that is higher than an aluminum concentration of the first conductive pattern and being thicker than the first conductive pattern;
a third conductive pattern on the first conductive pattern and including a metal nitride free of aluminum; and
a fourth conductive pattern on the third conductive pattern and including metal.

6. The semiconductor device of claim 5, wherein the metal nitride comprises titanium (Ti), tantalum (Ta), tungsten (W), ruthenium (Ru), niobium (Nb), molybdenum (Mo), hafnium (Hf), lanthanum (La), or any combination thereof.

7. The semiconductor device of claim 5, wherein the first conductive pattern further comprises a first metal carbide and the second conductive pattern further comprises a second metal carbide.

8. The semiconductor device of claim 7, wherein each of the first metal carbide and the second metal carbide comprises at least one of titanium (Ti), tantalum (Ta), tungsten (W), ruthenium (Ru), niobium (Nb), molybdenum (Mo), hafnium (Hf), and lanthanum (La), respectively.

9. The semiconductor device of claim 5, wherein the gate electrode further comprises a metal barrier pattern between the gate dielectric pattern and the second conductive pattern.

10. The semiconductor device of claim 5, wherein the third conductive pattern comprises tungsten.

11. The semiconductor device of claim 1, wherein the second conductive pattern is thicker than the first conductive pattern.

* * * * *